US00RE41512E

(19) United States
(12) Reissued Patent
Kitahara et al.

(10) Patent Number: US RE41,512 E
(45) Date of Reissued Patent: Aug. 17, 2010

(54) APPARATUS AND METHOD FOR MANUFACTURING SEMICONDUCTOR GRAINS

(75) Inventors: Nobuyuki Kitahara, Kyoto (JP); Toshio Suzuki, Higashiohmi (JP); Noboru Suda, Kyoto (JP); Shin Sugawara, Higashiohmi (JP); Hisao Arimune, Higashiohmi (JP)

(73) Assignee: Kyocera Corporation, Kyoto (JP)

(21) Appl. No.: 12/030,452

(22) Filed: Feb. 13, 2008

Related U.S. Patent Documents

Reissue of:
(64) Patent No.: 7,001,543
Issued: Feb. 21, 2006
Appl. No.: 10/277,610
Filed: Oct. 21, 2002

(30) Foreign Application Priority Data

| | | |
|---|---|---|
| Oct. 23, 2001 | (JP) | 2001-325471 |
| Nov. 27, 2001 | (JP) | 2001-361551 |
| Dec. 25, 2001 | (JP) | 2001-392776 |
| Jan. 29, 2002 | (JP) | 2002-020777 |

(51) Int. Cl.
*B29B 9/10* (2006.01)

(52) U.S. Cl. ..... 264/13; 264/14; 264/15; 75/340; 75/341; 117/53

(58) Field of Classification Search ..... None
See application file for complete search history.

(56) References Cited

U.S. PATENT DOCUMENTS

| | | | | | |
|---|---|---|---|---|---|
| 4,188,177 | A | * | 2/1980 | Kilby et al. | 425/5 |
| 4,322,379 | A | * | 3/1982 | Kilby et al. | 264/13 |
| 4,354,987 | A | * | 10/1982 | Iya | 264/13 |
| 4,430,150 | A | * | 2/1984 | Levine et al. | 117/73 |
| 4,986,941 | A | * | 1/1991 | Hendrix et al. | 264/13 |
| 6,074,476 | A | * | 6/2000 | Hanabe et al. | 117/11 |
| 6,106,614 | A | * | 8/2000 | Stephens et al. | 117/73 |

FOREIGN PATENT DOCUMENTS

| | | | |
|---|---|---|---|
| JP | 05-078115 | * | 3/1993 |
| JP | 08-150467 | * | 6/1996 |
| JP | 08-183694 | * | 7/1996 |
| JP | 09-052759 | | 2/1997 |
| JP | 11-012091 | * | 1/1999 |
| WO | WO 99/22048 | * | 5/1999 |

OTHER PUBLICATIONS

Amick, et al., "Improved High–Purity Arc–Furnace Silicon for Solar Cells" J. Electrical Science and Technology Feb. 1985 pp. 339–345.*

* cited by examiner

*Primary Examiner*—Mary Lynn F Theisen
(74) *Attorney, Agent, or Firm*—Hogan Lovells US LLP

(57) ABSTRACT

A crucible is formed of a cylindrical body member and a disk-shaped nozzle member fitted to the bottom portion of the body member, and the nozzle member is provided with a nozzle hole for discharging out a semiconductor molten solution dropwise therethrough. The semiconductor molten solution drops discharged out of the crucible through the nozzle hole are cooled and solidified during falling to become semiconductor grains. Silicon grains having high crystal quality can be manufactured at low cost.

14 Claims, 10 Drawing Sheets

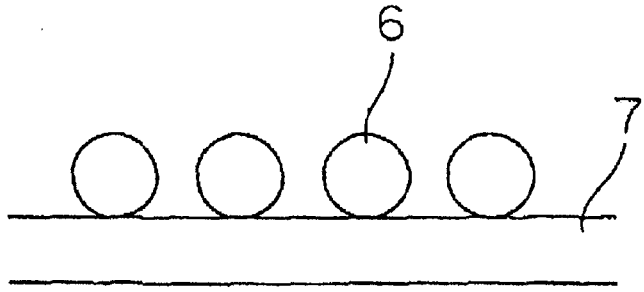
FIG. 6 ( a )
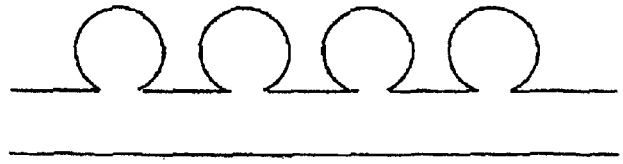
FIG. 6 ( b )
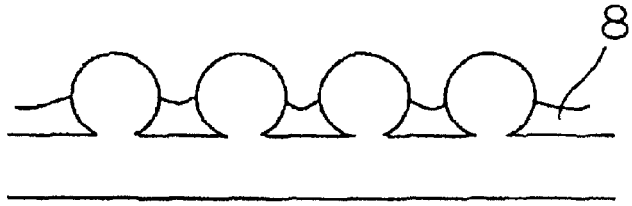
FIG. 6 ( c )
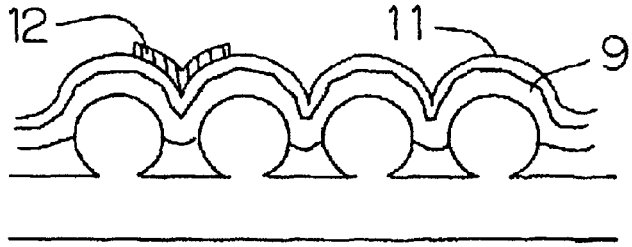
FIG. 6 ( d )

APPARATUS AND METHOD FOR MANUFACTURING SEMICONDUCTOR GRAINS

Matter enclosed in heavy brackets [ ] appears in the original patent but forms no part of this reissue specification; matter printed in italics indicates the additions made by reissue.

This application is based on applications Nos. 2001-325471, 2001-361551, 2001-392776 and 2002-020777 filed in Japan, the content of which is incorporated hereinto by reference.

FIELD OF INVENTION

The present invention relates to an apparatus and a method for manufacturing semiconductor grains.

DESCRIPTION OF THE RELATED ART

In developing next-generation solar batteries using silicon grains have been actively developed from the viewpoint of reducing the use amount of silicon and the manufacturing cost.

A method for manufacturing silicon grains will be described in the following.

As a material for manufacturing silicon grains, minute silicon grains obtained by grinding single crystal silicon material are used.

The material silicon grains are classified by shape or weight, then heated by the use of infrared rays or a high frequency coil, and thereafter allowed to free-fall to be made into spherical shapes, whereby silicon grains are manufactured.

However, this method requires steps of grinding and classification, so that the manufacturing process becomes complicated and long, disadvantageously to lower the productivity.

Further, since the shapes of the original silicon grains as the starting material influence the shapes of the resultant silicon spheres, uniform shapes and weights of original silicon grains are requested for manufacturing a solar battery element having a high converting efficiency.

An object of the present invention, is to provide an apparatus and method for manufacturing semiconductor grains, for use in manufacturing a solar battery and the like, capable of manufacturing semiconductor grains having a high crystal quality stably, efficiently and at a low cost.

SUMMARY OF THE INVENTION

The inventors have repeatedly made experiments and studies on the productivity and the crystal quality in providing semiconductor grains for use in a solar battery, and have come to have the following thoughts.

① as a crystal grain has a smaller granular diameter, the crystal quality of the grain is more improved, and in due course, the grain can become a single crystal. In other words, in a molten grain having a larger granular diameter, a number of cores as seed for crystallization are generated in the crystal. Therefore, without strictly controlling the temperature for growing crystal, the grain becomes polycrystalline.

② Further, the sufficient size of a crystal grain required for manufacturing a solar battery element in the viewpoint of the optical absorbing efficiency is about 300 μm, which value is equal to the thickness of a bulk polycrystal.

From above, the granular diameter of a semiconductor grain used for a solar battery element has only to be reduced to a value not more than the thickness of a bulk crystal. With this preposition, if semiconductor grains respectively having uniform spherical shapes and excellent crystal quality can be inexpensively and conveniently manufactured without need of complicated steps, a reliable solar battery having an excellent quality can be provided at a low cost.

① In an apparatus for manufacturing semiconductor grains, a crucible comprises a cylindrical body member and a disk-shaped nozzle member to be fitted to the bottom portion of the body member, the nozzle member being provided a nozzle hole for discharging out the semiconductor molten solution in the shape of drops therefrom.

Thereby, if the nozzle hole is worn to become large, only the nozzle member can be exchanged, so that semiconductor grains respectively having uniform diameters can be manufactured.

Further, according to a method for manufacturing semiconductor grains of the present invention, when the semiconductor molten solution is discharged out in the shape of drops from the nozzle member to allow to free-fall, a pressure is applied to the semiconductor molten solution in the crucible to discharge the same from the nozzle member in the shape of drops. Thereby, it becomes possible to manufacture semiconductor grains having uniform granular diameters and high crystallinity degree respectively.

② In the method for manufacturing semiconductor grains comprising discharging the semiconductor molten solution from the nozzle member in the shape of drops to allow to free-fall, and cooling and solidifying the same during the free-falling, the inventors have observed carefully such a phenomenon that grains of high crystallinity degree can be confirmed at high frequency in a highly abrasive (easily worn) nozzle member material, but the crystallinity degree of a grain is lowered in a nozzle member material in which the abrasiveness is limited (hardly worn) for obtaining a long life of the nozzle member.

As a result of analyzing this phenomenon, the inventors have found that, due to abrasion of the nozzle member material, minute particles of the nozzle member material are mixed into the semiconductor molten solution to be discharged and the semiconductor molten solution grows crystal with the minute particles acting as the cores or seeds, whereby semiconductor grains having high crystallinity degree can be obtained. And the inventors have made the present invention based on this finding.

As mentioned above, a method for manufacturing semiconductor grains according to the present invention includes steps of preliminarily mixing seeds acting as cores of crystallization into a semiconductor molten solution, then discharging out the semiconductor molten solution dropwise through the nozzle hole of the crucible to allow to free-fall, and cooling and solidifying the semiconductor molten solution during falling. The obtained semiconductor grains are of improved crystal quality and therefore they have an extremely high industrial value.

③ In an apparatus for manufacturing semiconductor grains according to the present invention, surface-treated is provided on such a portion of the inner wall surface of the crucible that contacts the semiconductor molten solution when the semiconductor molten solution in the crucible is discharged out through the nozzle hole to make semiconductor grains.

By such surface-treatment, particle formation on the inner wall of the crucible can be prevented. As a result, corrosion of the crucible is stopped and semiconductor grains having a carbon or other impurity concentration can be formed, so that a solar battery having a high converting efficiency can be manufactured.

④ It is necessary to prevent drops of semiconductor molten solution from contacting and being bound together to become large-sized grains, in the process of discharging out the semiconductor molten solution in the shape of drops through the nozzle hole of the crucible to allow to free-fall, and cooling and solidifying the semiconductor molten solution during falling.

When drops of semiconductor molten solution contact one another during falling in an inert gas atmosphere at a high temperature, they are usually bound to become large-sized grains. In addition, when a silicon material, which is expanded in volume during solidification, is used, projections are formed on the surface of grains obtained by cooling and solidifying the semiconductor molten solution drops during falling, due to reduction of the volume expansion.

Therefore, according to the present invention, the inert gas atmosphere is adjusted to an atmosphere containing oxygen. Thereby, if the drops one another at a high temperature, they are not bound during falling, so that the drops can be prevented from becoming large-sized. This is because each drop forms its surface layer in an atmosphere containing oxygen. In addition, after falling in an atmosphere containing oxygen, each grain shows an apparent spherical shape and no projection is formed on its surface due to reduction of volume expansion when solidified.

As a result, each grain can be formed in a spherical shape.

Further, in the step of making single crystal, a surface layer formed of oxidization is required for maintaining the shape of each grain, in order to re-melt the grain by heating at a temperature higher than its melting point.

According to the present invention, since the surface layer is formed in the inert gas atmosphere containing oxygen as abovementioned, a single crystal grain having a shape reflected by the spherical shape as the starting shape can be obtained after it is re-melted.

The concrete structure of the present invention will be described in the following with reference to the appended drawings.

BRIEF DESCRIPTION OF THE DRAWINGS

FIGS. 6(a) to 6(d) are sectional views showing a process for manufacturing a photoelectric converting device with the use of silicon grains according to the present inventions.

DETAILED DESCRIPTION OF THE INVENTION

First Embodiment

Figure 1:
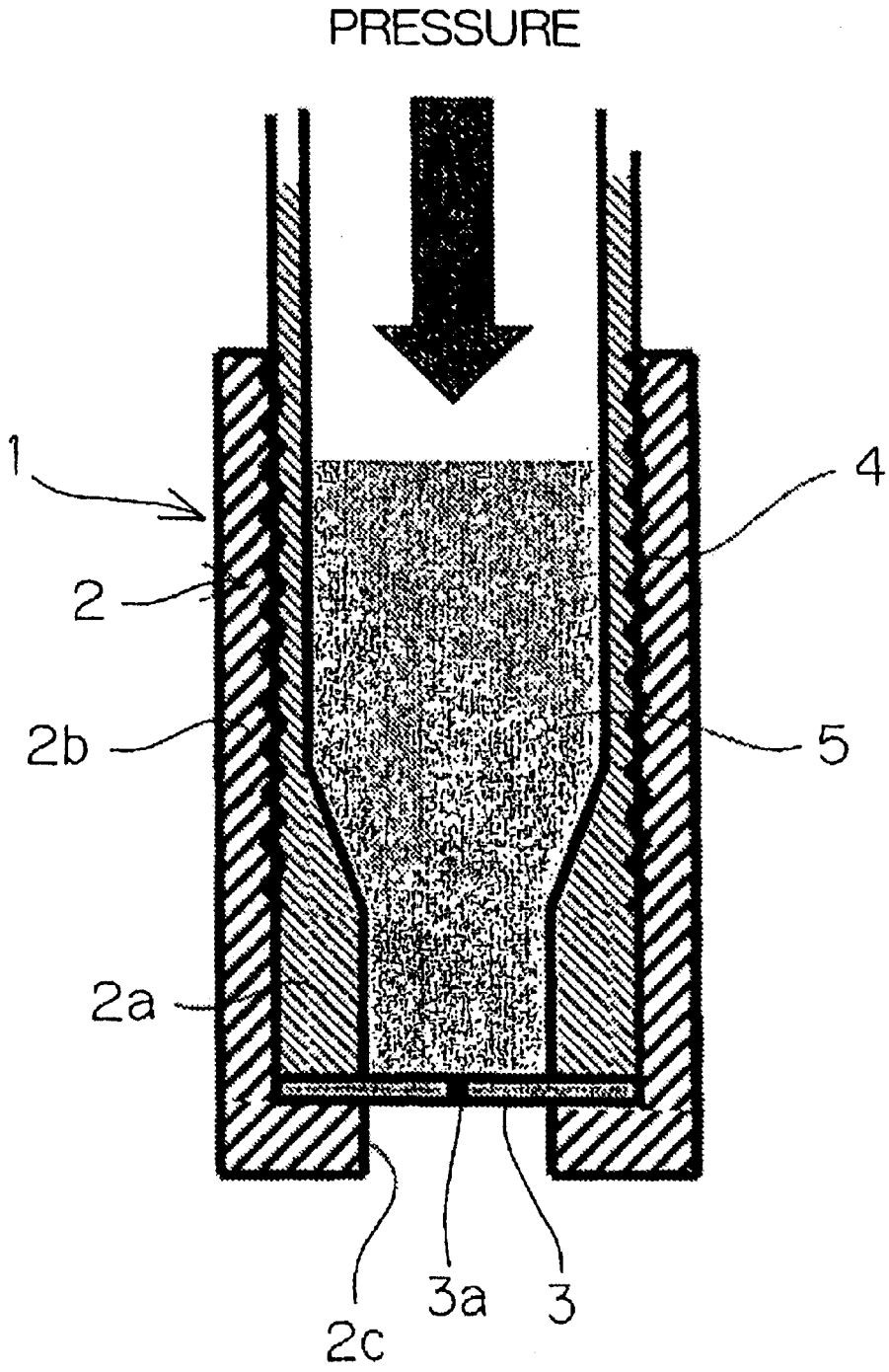
FIG. 1 is a view showing an embodiment of an apparatus for manufacturing semiconductor grains according to the present invention.

FIG. 1 is a view showing a crucible for manufacturing a semiconductor grains of an embodiment of the present invention. Numeral 1 indicates the whole of the crucible, and numeral 2 indicates a body member, numeral 3 indicating a nozzle member.

The crucible 1 comprises the cylindrical body member 2 and the disk-shaped member 3 fitted to the bottom portion of the body member 2.

The body member 2 comprises an inner wall member 2a having an inner wall hindering reaction with silicon and an outer wall member 2b disposed outside the inner wall member 2a. The outer wall member 2b is provided for reinforcing the body member 2. A screw 4 is threaded on each of the outside of the inner wall member 2a and the inside of the outer wall member 2b.

Each of the inner wall member 2a and the outer wall member 2b are formed of a sintered body compacted by casting, hot press or the like. Aluminum oxide, silicon carbide, graphite or the like is suitable for hindering reaction with silicon, but graphite sintered by hot press is suitable in view of easy processing. When a member is formed of graphite, it is, after processed, washed with an acid for raising its purity, and then washed with water and dried to be used.

Provided on the lower side of the crucible 1 is the nozzle member 3 having a nozzle hole 3a for discharging out a molten solution of a semiconductor material (hereinafter referred to as semiconductor molten solution) therefrom. This nozzle member 3 is mounted on the upper side of a small-diametered portion 2c at the bottom of the outer wall member 2b.

After the nozzle member 3 is mounted on the small-diametered portion 2c, the inner wall member 2a is screwed down from above to press and fix the nozzle member 3. Thus the body member 2 is assembled. On the other hand, by upwardly screwing the inner wall member 2a, the nozzle member 3 can be removed out.

The nozzle member 3 is formed of silicon carbide, diamond, aluminum oxide, cubic boron nitride or the like. The nozzle member 3 is formed by processing a single crystal or polycrystalline substance of one of the abovementioned materials or by sintering each material to compact the same.

It is preferable that, in order to prevent abrasion of the nozzle hole 3a and obtain stable semiconductor grains, the nozzle member 3 is formed of any one selected from the group consisting of silicon carbide having a gravity not less than 3.00 g/cm$^3$, aluminum oxide having a gravity not less than 3.30 g/cm$^3$, cubic boron nitride having a gravity not less than 3.15 g/cm$^3$ and diamond having a gravity not less than 3.35 g/cm$^3$.

Further, it is preferable that the nozzle member 3 is formed of any one selected from the group consisting of single crystal silicon carbide, single crystal aluminum oxide (sapphire), single crystal cubic boron nitride and single crystal diamond, because, with such a material, abrasion of the nozzle hole 3a is surely prevented and stable semiconductor grains can be obtained.

It is preferable that the diameter of the nozzle hole 3a is 5 μm to 100 μm. It is difficult yet in the today's technique to form the diameter of drops of the nozzle hole 3a less than 5 μm. Further, if the diameter of the nozzle is more than 100 μm, the particle diameter of the drops of semiconductor molten solution becomes large, so that excellent crystal is hard to obtain.

It is possible to provide a plurality of nozzle holes 3a in the nozzle member 3. By providing a plurality of nozzle holes 3a, the productivity can be raised in accordance with the number of the nozzle holes 3a, which is advantageous in manufacturing.

The flow amount (flow rate) of the semiconductor molten solution from the nozzle hole 3a is determined based on the diameter of the nozzle hole 3a and the gaseous pressure. And the spherical diameter of the drop is determined in relation to the surface tension of the molten solution during discharging.

The nozzle holes 3a are worked by machining, laser machining or ultrasonic machining so that they have the same diameters respectively. In addition, the machining is performed so that the thickness of the nozzle member 3 with respect to the worked diameter of each nozzle hole 3a becomes constant.

By forming the body member 2 and the nozzle member 3 of separate members from each other and assembling them into the whole of the crucible 1 as above-mentioned, only the nozzle member 3 can be exchanged, and the expensive body member 2 can be repeatedly used.

Silicon material is thrown into such a crucible 1, and the whole of the silicon material is melted with the use of an induction heater or a resistance heater (not shown). The silicon molten solution 5 is pressed from above by argon gas or the like, for example, not more than 0.7 MPa (mega $10^6$ pascals) to be extruded from the nozzle hole 3a of the nozzle member 3, so that the silicon molten solution is sprayed to make a number of drops. These drops of the silicon molten solution are allowed to free-fall. During falling, the drops are solidified to become grains of single crystal silicon or polycrystalline silicon, which are contained in a container.

If the pressure of this argon gas is less than 0.01 MPa, the silicon molten solution cannot be jetted out, and in addition, if the pressure is more than 0.7 MPa, the particle diameter of the jetted silicon molten solution becomes too large to obtain excellent crystal.

The obtained silicon grains are used for manufacturing a solar battery. Therefore, it is preferable that the silicon to be melted contains desired additional impurities required for fabricating semiconductor grains.

EXAMPLE 1

A nozzle members 3 having nozzle holes 3a of variety of diameters respectively worked by laser machining was manufactured to assemble a crucible. Then silicon in the crucible was melted and silicon grains were manufactured, and the diameters and crystal qualities of the obtained silicon grains were evaluated.

The test was carried out as follows.

18 grams of silicon material was filled into a crucible in an atmosphere of an inert gas such as Ar or He kept at a temperature of 1450° C. through a passage being similarly in an inert gas atmosphere, and melted. The crucible was formed of graphite (graphite DFP-2 manufactured by POCO Graphite, Inc. or the like) having dimensions of 19.0 mm ϕ in the inner diameter, 25.0 mm ϕ in the outer diameter and 143 mm in length. Variously changed gaseous pressures were applied to the sufficiently melted material to spray and discharge the whole amount of the molten material straight out through a nozzle hole. At this time, with the gaseous pressure being not more than 0.01 MPa, the molten solution could not be jet forth through nozzle holes of any diameter.

The grain diameter distribution of the spherical silicon grains produced by this jet and the crystallinity degree thereof were detected. The grain diameter distribution was detected by screening the grains through a sieve and calculating the grain diameter distribution based on the ratio of the distribution of the grain numbers. The crystallinity degree was detected by embedding each silicon grain into a resin and grinding and mirror-finishing its sectional surface, thereafter etching with a mixed acid of hydrofluoric acid, nitric acid and acetic acid, and observing the sectional surface, so that the proportion in number of the grains having 3 to 5 crystal grains with respect to the whole grains was regarded as the crystallinity degree.

TABLE 1

| | Nozzle Hole Diameter (μm) | Jet Pressure (MPa) | Average Grain Diameter (μm) | Crystallinity Degree (%) |
|---|---|---|---|---|
| Example 1-1 | 30 | 0.3 | 254 | 85 |
| 1-2 | 40 | 0.3 | 320 | 74 |
| 1-3 | 60 | 0.3 | 450 | 63 |
| 1-4 | 100 | 0.3 | 850 | 54 |
| Comparative 1 | 120 | 0.3 | 1000 | 23 |
| Example 2-1 | 60 | 0.2 | 325 | 82 |
| 2-2 | 60 | 0.5 | 480 | 60 |
| 2-3 | 60 | 0.7 | 730 | 55 |
| Comparative 2-1 | 60 | 0.01 | Not Jetted | Not Jetted |
| 2-2 | 60 | 0.8 | 950 | 38 |

From Table 1, when the nozzle hole diameter is not less than 30 μm and not more than 100 μm, the average grain diameter was less than 850 μm and in addition, the crystallinity degree was beyond 50%, and therefore, this case can be estimated as good.

However, working for opening a nozzle hole having a diameter less than 30 μm was hard and such working per se could not be performed.

On the other hand, when the nozzle hole diameter is more than 100 μm, the average grain diameter of the obtained grains was as large as more than 850 μm, and the crystallinity degree thereof rapidly became worse.

The jet pressure is suitably not less than 0.01 MPa and not more than 0.7 MPa, and preferably not less than 0.01 MPa and not more than 0.5 MPa.

Second Embodiment

In this second embodiment, when silicon material is put into a crucible 1 and the whole of the silicon material is melted by the use of an induction heater or a resistance heater (not shown), grains acting as cores of crystallization are added to the silicon material.

These grains as cores of crystallization are preferably hard to react in the silicon molten solution. Grains of various kinds of materials can be used, if they do not change their shape or disperse as impurities to cause to lower the semiconductor quality. For example, aluminum oxide, silicon oxide, diamond, graphite or the like can be preferably used.

The silicon molten solution is pressed from above by argon gas or the like, for example, not more than 0.5 MPa to be extruded from the nozzle hole 3a of the nozzle member 3, so that the silicon molten solution is sprayed to make a number of drops. These drops of the silicon molten solution are allowed to free-fall. During falling, the drops are solidified to make grains of single crystal silicon or polycrystalline silicon, which are contained in a container.

EXAMPLE 2

A crucible formed of graphite (graphite DFP-2 manufactured by POCO Graphite, Inc. or the like) having dimensions of 19.0 mm ϕ in the inner diameter, 25.0 mm ϕ in the outer diameter and 143 mm in length was used. The crucible had a nozzle member 3. A nozzle hole 3a of the nozzle member 3 is formed by laser machining.

The test was carried out as follows.

This crucible was set in a furnace capable of being kept at an atmosphere of an inert gas such as Ar or He, and the temperature was set at 1450° C.

Grains acting as cores were weighed and added to the silicon material, and the mixture was uniformly dispersed in a container such as a polyethylene bag or the like. 18 grams of this silicon material containing the core grains was filled into the crucible kept at the temperature of 1450° C. through a passage similarly kept in an atmosphere of an inert gas and melted.

Gaseous pressure of 0.15 MPa was applied to the sufficiently melted silicon material to spray the whole of the silicon material straight from the nozzle hole 3a.

The grain diameter distribution of the spherical silicon grains produced by this jet and the crystallinity degree in the distribution were detected. The grain diameter distribution was detected by screening the grains through a sieve and calculating the grain diameter distribution based on the ratio of the distribution of the grain numbers.

EXAMPLE 2-1

0.02 grams of silicon carbide grains (2–3 μm) as cores were weighed and added to silicon material, and the mixture was uniformly dispersed in a container such as a polyethylene bag or the like. Thereafter, the silicon material is sprayed under the above-mentioned condition.

The obtained silicon grains were classified by shape. The result was that the grains were classified into ① tear-shaped grains ② diamond-shaped grains and ③ spherical grains, and the constitutional ratio was 2:7:1.

Figure 2:
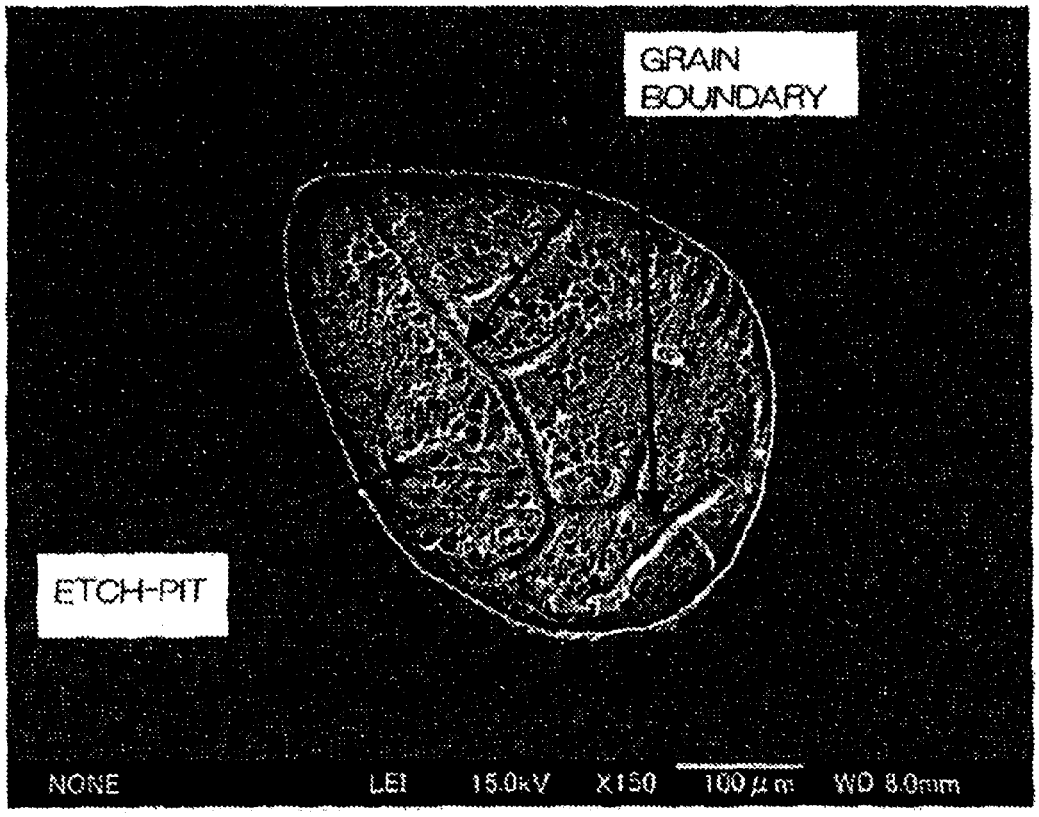
FIG. 2 is a sectional SEM image of a tear-shaped grain.
Figure 3:
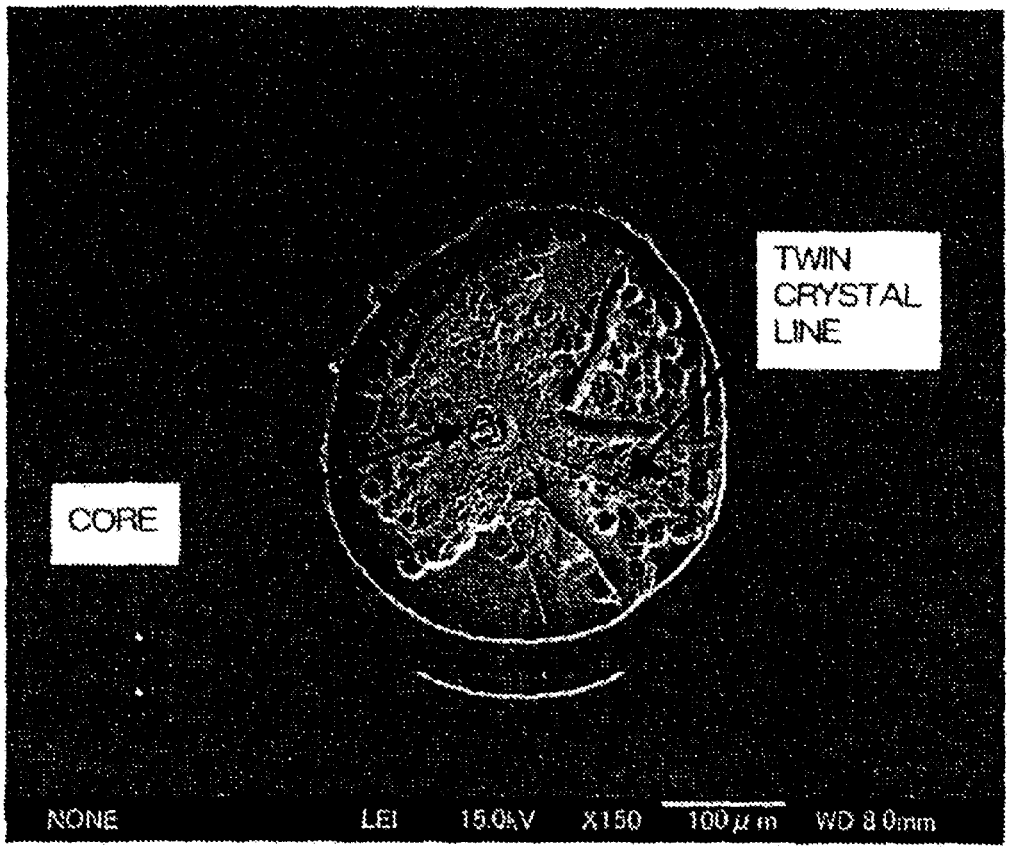
FIG. 3 is a sectional SEM image of a diamond-shaped grain.
Figure 4:
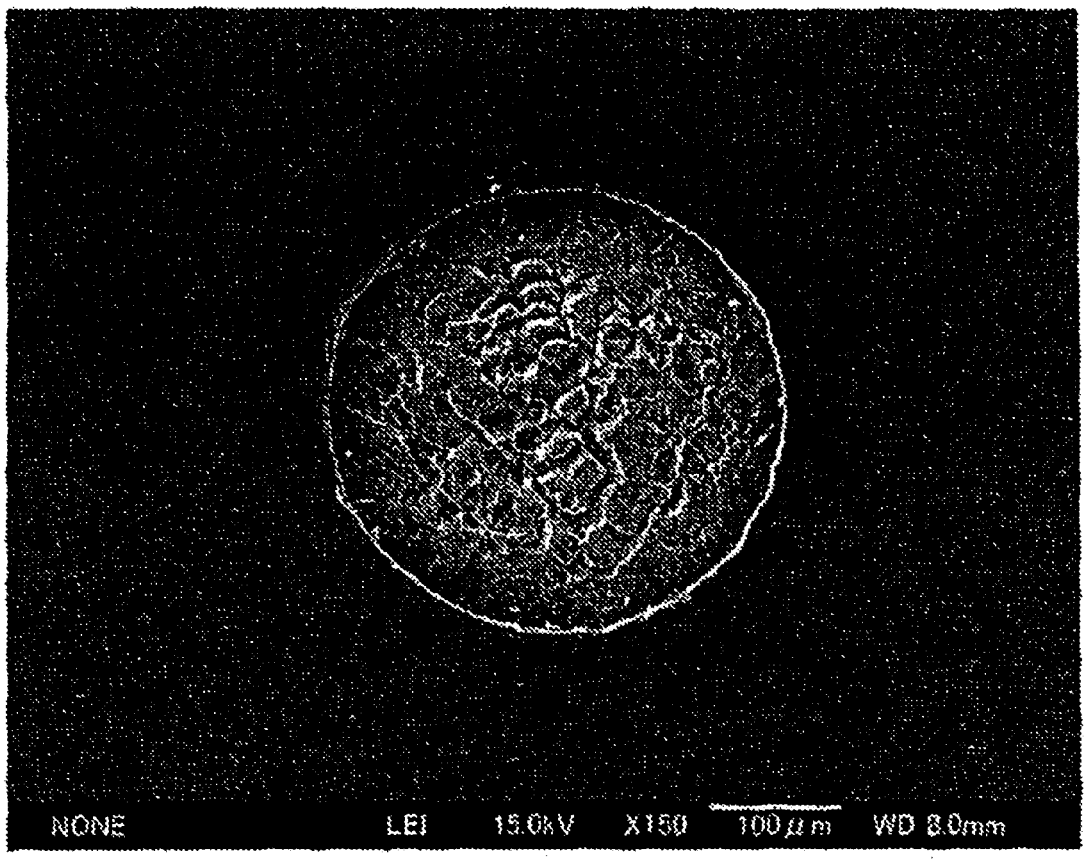
FIG. 4 is a sectional SEM image of a spherical grain.

The sectional surfaces of the grains of each of the above-mentioned shapes were subjected to SEM (Scanning Electron Microscope) observation, and the result is shown in FIGS. 2 to 4.

The SEM observation was carried out by embedding each silicon grain into a resin and grinding and mirror-finishing its sectional surface, thereafter sufficiently etching the same with a mixed acid of hydrofluoric acid, nitric acid and acetic acid, and observing the grain boundary.

FIG. 2 is a SEM image of a tear-shaped grain and FIG. 3 is a SEM image of a diamond-shaped grain, FIG. 4 being a SEM image of a spherical grain.

As shown in the SEM images of FIGS. 2 to 4, deep etch-pits are seen here and there. The relations of the grain shape, the number of etch-pits and the number of crystalline grains constituting the silicon grain were classified as follows.

① (FIG. 2) A number of etch-pits were observed, but the number of the crystal grains constituting the silicon grain was about 3 to 5.

② (FIG. 3) A number of etch-pits were observed similarly to ①, but the grain consisted of a single grain (twin crystal) having a high crystal quality. In addition, in the diamond-shaped grain ②, an extraordinary granular etching form (core) was observed on the twin crystal line.

③ (FIG. 4) It was proved that this grain was a polycrystalline substance in which the central portion was constituted by granular crystal and the peripheral portion had prismatic crystal.

Comparative Example 2-1

Silicon material was sprayed according to the method of Example 2 but without adding core grains. The obtained grains were classified by shape.

The result was that the grains were classified into ① tear-shaped grains and ③ spherical grains, and the constitutional ratio was 1:9. ② Diamond-shaped grains were hardly observed.

EXAMPLE 2-2

Core grains were added to silicon material as shown in Table 2, and the silicon material was sprayed according to the method of Example 1 to produce silicon grains. The grains were classified by shape by observing under a telescope. The silicon grains manufactured as a Comparative Example without adding core grains were similarly classified by shape.

TABLE 2

| Added grains | Diamond-shaped | Tear-shaped | Spherical shaped | Crystallinity Degree (%) |
|---|---|---|---|---|
| Example 2-1 Silicon Carbide | 70 | 18 | 12 | 88 |
| Example 2-2 Aluminum Oxide | 68 | 17 | 15 | 85 |
| Example 2-3 Silicon Oxide | 65 | 16 | 19 | 81 |
| Example 2-4 Diamond | 72 | 22 | 6 | 94 |
| Example 2-5 Graphite | 68 | 17 | 15 | 85 |
| Comparative 2 Not Added | 4 | 8 | 88 | 12 |

The constitutive ratio of the shapes of the sprayed silicon grains in the case of adding core grains was apparently different frond that in the case of not adding core grains.

When the core grains were added, highest was the constitutive proportion of the diamond-shaped grains, which showed a high crystal quality in Example 2-1.

Third Embodiment

Figure 5:
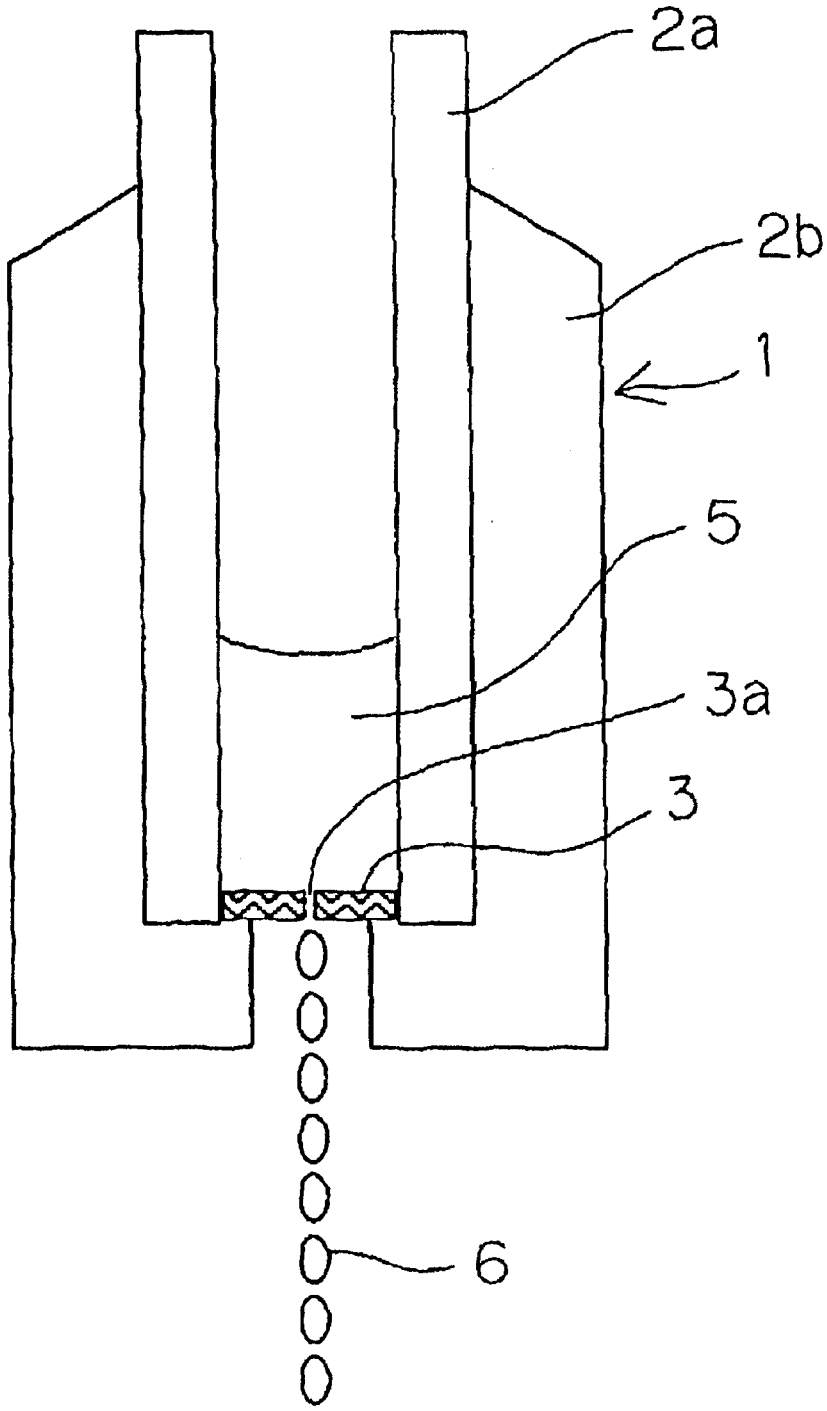
FIG. 5 is a view showing another embodiment of an apparatus for manufacturing semiconductor grains according to the present invention.

FIG. 5 is a view showing another embodiment of an apparatus for manufacturing silicon grains according to the present invention.

An outer wall member 2b of a crucible 1 can be formed of Aluminum oxide, silicon carbide, graphite, boron nitride, silicon nitride or the like from the point of view of its necessary strength at temperatures near 1450° C. which is the melting point of silicon.

Since an inner wall 2a directly contacts silicon molten solution 5, an inner wall member 2a is preferably formed of silicon carbide SiC, graphite or the like which is hard to react with the silicon molten solution. However, graphite sintered by hot press is most preferable from the point of view of easiness to work and low cost.

When sintered graphite is used for manufacturing the crucible for melting silicon material, it is formed so dense as to have a density of about 1.8.

However, air bubbles are still present inside the inner wall member of the crucible. If the sectional surface of a graphite crucible is examined by SEM, it is confirmed that silicon has permeated as deep as 300 to 400 μm from the surface. It is presumable that, in the process of this corrosion, particles released from the graphite-formed inner surface of the crucible react with the silicon molten solution and carbon comes out as impurities. Further, even if a crucible is formed of another material, more or less corrosion proceeds at the temperature of the silicon molten solution and thereby impurities come out.

Therefore, according to the present invention, an inner wall portion of an inner wall member 2a, which contacts a silicon molten solution, is surface-treated in order to prevent particles from being released.

There are two kinds of surface-treatments as the following (1), (2).

(1) A coating of silicon carbide is formed. The coating of silicon carbide is formed by CVD method and the like. Since the inner surface portion of the inner wall member 2a, which contacts silicon molten material 5, is an inner surface of a pipe in shape, a gas flow in the CVD method is hard to reach the portion and a uniform amount of coating throughout the whole of the inner surface of the pipe is hard to be ensured. However, it is possible to provide a sufficient thickness of coating on the inner surfaces portion by selecting optimum coating conditions.

(2) A coating of amorphous carbon is formed by impregnating with a resin and heat-treatment. This method is applied to a case in which the inner wall member 2a is formed of graphite. The graphite is dipped in a specified resin so as to impregnate the air bubbles with the resin. Thereafter, by heating to a predetermined temperature, the graphite is baked to change the surface of the carbon mold to a dense surface. One example of such a treatment is glassy carbon by Tokai Carbon Co., Ltd. ((2) ends here).

By such a treatment, corrosion is stopped, so that silicon grains with a low impurity concentration can be formed and a photoelectric converting device having a high converting efficiency can be provided.

A nozzle member 3 is provided separately from the cylindrical crucible 1 and is disposed inside the lower end portion of the crucible body 1. The nozzle member 3 is formed of, silicon carbide, diamond, aluminum oxide, cubic boron nitride or the like. Further, the nozzle member 3 has a nozzle hole 3a for discharging a silicon molten solution 5. A plurality of nozzle holes may be provided. The nozzle hole 3a is worked by machining or laser machining in such a manner that the inner diameter of the lower end of the nozzle hole 3a is a predetermined value.

After the inner wall member 2a, the outer wall member 2b and the nozzle member 3 are formed respectively into predetermined shapes, they are washed with an acid, washed with water and dried. Then, the nozzle member 3 is disposed at the bottom portion of the outer wall member 2b, and the inner wall member 2a is set inside the outer wall member 2b to assemble the crucible 1.

Silicon material is fed into the crucible 1 having such a structure, and it is melted with the use of an induction heater or a resistance heater to make a silicon molten solution 5. The silicon molten solution 5 is pressed from above by a gas such as an inert gas to be extruded from the nozzle hole 3a of the nozzle member 3, so that a large number of dropped molten silicon are sprayed. During falling, the silicon drops are solidified to become grains of single crystal or polycrystalline silicon, which are contained in a container (not shown).

The silicon grains 6 are used for manufacturing a solar battery. Therefore, it is preferable to make the silicon material preliminarily contain desired impurities.

A method for manufacturing a photoelectric converting device (solar battery) using such silicon grains will be described in the following with reference to FIG. 6.

A number of silicon grains 6 containing one conductive type semiconductor impurities are disposed on a metal substrate 7 constituting one-side electrode (FIG. 6(a)). And by heating this at a temperature higher than 600° C., the silicon grains 6 are joined to the metal substrate 7(FIG. 6(b)). An insulating material 8 is interposed between respective silicon grains (FIG. 6(c)), and a semiconductor layer 9 containing another conductive type semiconductor impurities is formed on the silicon grains 6 to manufacture a photoelectric converting device.

The method is not limited to forming a semiconductor layer 9 containing another conductive type semiconductor impurities on the silicon grains 6, but a region containing another conductive type semiconductor impurities may be formed on a portion of the surface region of each silicon grain.

In the case of manufacturing such a photoelectric converting device as abovementioned, it is necessary to evaluate the physical property values of the silicon grains having influences on the converting efficiency. Nowadays, methods for evaluating the physical properties of flat specimen surfaces such as a silicon wafer surface have been established. However, since the shapes and sizes of the silicon grains manufactured by spraying as according to the present invention are not uniform, the measuring methods have not been established, so that it has been difficult to quantitatively evaluate the physical properties thereof.

However, according to SIMS (Secondary Ion Mass Spectroscopy), the impurity element concentration of each silicon grain can be measured. Therefore, the relation between the impurity concentration of the silicon grains measured according to SIMS and the converting efficiency of a photoelectric converting device manufactured with the use of these silicon grains can be considered for evaluating the silicon grains.

The carbon concentration of a silicon grain manufactured by spraying a silicon molten solution from a nozzle hole is measured according to SIMS. The result is that the carbon concentration of the outer surface of the grain is higher than that of the inner portion of the grain, but in the portion of the grain more than 5 μm deep from the outer surface, the carbon concentration maintains a fixed value.

when these silicon grains are used, the surface portion of each is removed by deeper than 5 μm from the outer surface by the use of an acidic solution, dry etching, sand blast or the like, and thereafter the grains are put into a process of manufacturing a photoelectric converting device. Therefore, the fixed impurity concentration of the grain portion deeper than 5 μm from the outer surface is regarded as the impurity concentration of this grain.

The manufacturing conditions of a photoelectric converting device have influence on the converting efficiency indicating the capability of the photoelectric converting device.

The converting efficiency is made highest by making optimum the conditions of forming an amorphous or polycrystalline silicon layer 9 throughout the upper portions of the silicon grains, and patterns and forming process of a pull electrode formed of Ag paste or the like and provided on the layer 9.

However, when the carbon content of each silicon grain was more than 50 ppm, any photoelectric converting device manufactured with the use of such silicon grains could not have a converting efficiency higher than 2% even by making optimum the conditions of the manufacturing process.

The cause is presumed as that, since carbon forms impurity level in band gaps of the silicon grains to trap carriers, the electromotive force is reduced. In addition, it is presumed as a cause that the diffusion lengths of electrons are reduced due to the impurities.

Therefore, by manufacturing silicon grains using a crucible of which the portion contacting the silicon molten solution has been surface-treated as abovementioned, the carbon impurity concentration can be lowered to not more than 50 ppm. A photoelectric converting device manufactured by the use of these silicon grains can have a converting efficiency not less than 3%, if the conditions of the manufacturing process are made optimum.

EXAMPLE 3-1

Graphite material sintered by hot press was worked into predetermined shapes to form an outer wall member 2b and an inner wall member 2a. The inner surface of the inner wall member 2a is coated with a silicon carbide layer according to CVD method. The coating step was carried out so that the thickness of the thinnest portion of the silicon nitride layer in the innermost portion of the cylindrical inner wall member 2a could be not less than 100 μm.

With the use of a silicon carbide substrate formed according to CVD method, a disk-shaped nozzle member 3 was formed to have a thickness of 1.0 mm. A nozzle hole 3a was defined in the center of the nozzle member 3 by laser machining. By making optimum the laser machining conditions, the diameter of the nozzle hole 3a was made 100 μm at the lower opening of the nozzle member 3. These members were assembled to obtain a crucible having such a structure as shown in FIG. 5.

The obtained crucible was set in a furnace capable of keeping an inert gas atmosphere and the temperature was raised to 1450° C. 18 grams of silicon material was fed, through a passage similarly kept in an inert gas atmosphere, into the crucible kept at 1450° C., so that the silicon material was completely melted to form a molten silicon 5. At this time, used was silicon material added with a material containing a predetermined amount of boron to adjust the boron concentration of the whole of the silicon material to a predetermined optimum value.

After waiting till the silicon material came into a sufficient molten state, the molten silicon 5 was pressed by argon gas at a pressure of 0.1 MPa to jet out the molten silicon 5 from the nozzle hole 3a, whereby silicon grains 6 were obtained.

Then, with the use of the obtained silicon grains 6, a solar battery was manufactured by a method shown in FIG. 6. First, the silicon grains 6 were disposed on a metal substrate 7 (FIG. 6(a)). Next, the whole of this was heated to bond the silicon grains 6 to the metal substrate 7 (FIG. 6(b)). An insulating layer 8 was formed in the spaces between respective silicon grains (FIG. 6(c)). An amorphous or polycrystalline silicon layer 9 and transparent conductive layer 11 (ITO) were formed on the whole of the insulating layer 8 and the upper portions of the silicon grains (FIG. 6(d)). Since the silicon grains 6 were p-type, the silicon layer 9 was formed as n-type.

A solar battery was thus obtained and the power generating efficiency thereof was measured.

The metal substrate 7 was one electrode and silver paste was coated on the transparent conducive layer 11 to form the other electrode 12. Light of a predetermined strength and a predetermined wavelength was applied to the solar battery to measure the solar battery characteristics and calculate the converting efficiency thereof. As a result, the converting efficiency was 5.3%.

Then, the carbon concentration of the silicon grains 6 was measured according to SIMS and the result was 40 ppm.

EXAMPLE 3-2

Graphite material sintered by hot press was worked into predetermined shapes to form an outer wall member 2b and an inner wall member 2a. A coating of amorphous carbon was provided on the surface of the inner wall member 2a by a resin impregnating treatment. In this treatment, with the use of glassy carbon made by Tokai Carbon Co., Ltd and the inner wall member 2a was dipped in a specific resin to impregnate inner air bubbles with the resin and it was heated to a predetermined temperature and baked, so that the property of the carbon formed surface was changed to become dense. Thereafter, a solar battery was manufactured by the similar method to that of Example 1.

The power generating efficiency of the obtained solar battery was examined and the result was that the converting efficiency was 4.0%.

Then, the carbon concentration of the silicon grains 6 was measured according to SIMS and the result was 48 ppm.

Comparative Example 3

Graphite material sintered by hot press was worked into predetermined shapes to form an outer wall member 2b and an inner wall member 2a. Without applying any treatment for preventing particle release to the inner surface of the inner wall member 2a, a solar battery was manufactured by the similar method to that of Example 3.

The power generating efficiency of the obtained solar battery was examined and the result was that the converting efficiency was 1.2%.

Then, the carbon concentration of the silicon grains 6 was measured according to SIMS and the result was 65 ppm.

Fourth Embodiment

Figure 7:
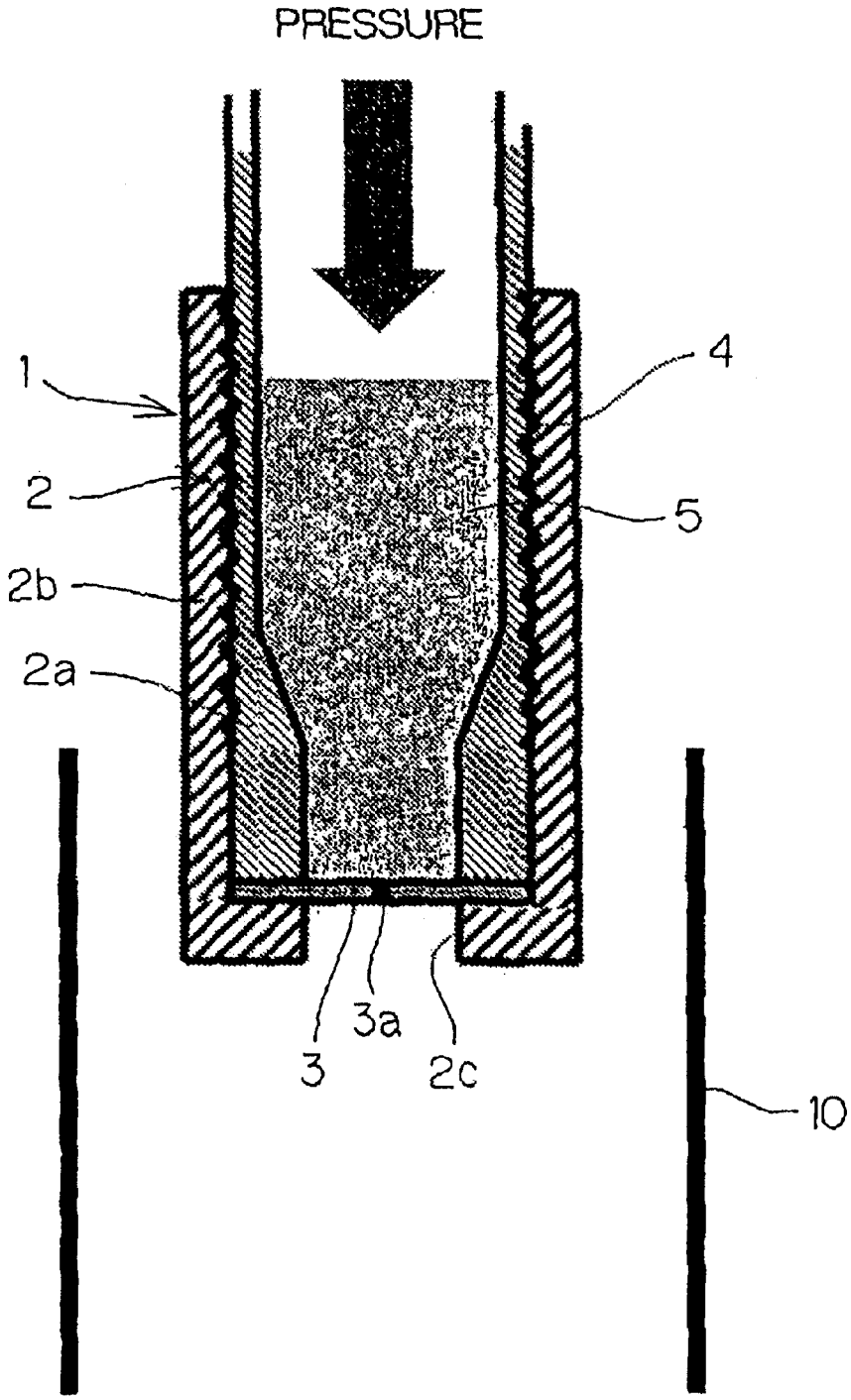
FIG. 7 is a view showing a further embodiment of an apparatus for manufacturing semiconductor grains according to the present invention.

FIG. 7 is a view showing a further embodiment of an apparatus for manufacturing semiconductor grains according to the present invention. The same members with those of FIG. 1 are designated with the same numbers. Description of the same structure of a crucible with that of FIG. 1 is omitted.

In this embodiment 4, silicon material is fed into a crucible 1, and the whole of the silicon material is melted with the use of an induction heater or a resistance heater (not shown). The silicon molten solution 5 is pressed from above by argon gas or the like, for example, not more than 0.5 MPa to be extruded from the nozzle hole 3a of the nozzle member 3, so that the silicon molten solution 5 is sprayed to make a number of drops.

These sprayed drops of the silicon molten solution 5 free-fall inside a cylindrical body 10 kept in a predetermined gas atmosphere. During falling, the drops are solidified to become grains of single crystal or polycrystalline silicon, which are contained in a container.

The cylindrical body 10 can be kept airtight. A quartz cylinder, an alumina cylinder, a stainless cylinder or the like can be used as the cylindrical body 10.

The pressure and the gas concentration of the atmosphere gas in the cylindrical body 10 can be controlled. The control method is not specifically limited.

Such silicon grains are used for manufacturing a solar battery. Therefore, it is preferable that the silicon material to be melted contains desired semiconductor impurities.

Thereafter, the recovered silicon grains are spread all over a dish-like quartz container and heat-treated together with the quartz container in a baking furnace kept in a predetermined atmosphere. Thereby, the silicon grains are re-melted, so that single crystal silicon grains can be manufactured.

Figure 8:
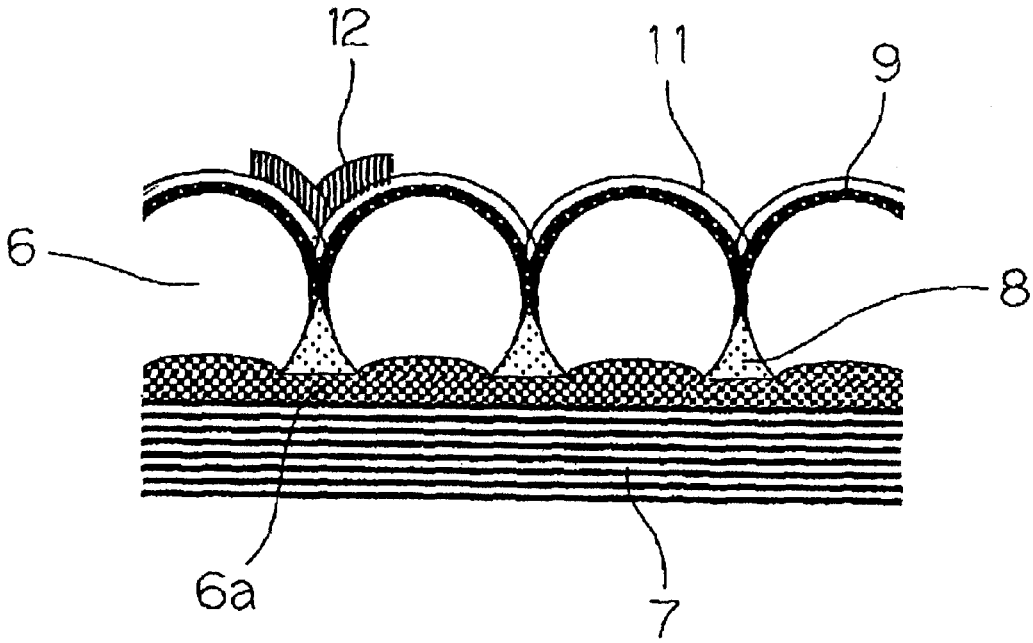
FIG. 8 is a view showing a process for manufacturing a photoelectric converting device with the use of semiconductor grains according to the present inventions.

With the use of the obtained silicon grains, a photoelectric converting device shown in FIG. 8 is manufactured. First, not less than 5 μm depth of the surface portion of each silicon grain 6 is removed by etching. Next, the silicon grains 6 are disposed on a metal substrate 7. Then the whole is heated to bond the silicon grains 6 onto the metal substrate 7 through a bonding layer 6a. An insulating layer 8 is formed in the spaces between the silicon grains 6 on the metal substrate 7. An amorphous or polycrystalline silicon layer 9 is coated all over the same. At this time, since the silicon grains 6 are single conductive p-type or n-type, the silicon layer 9 is formed as reverse conductive n-type or p-type. Further, a transparent conductive layer 11 is formed thereon.

The metal substrate 7 is one electrode and silver paste is coated on the transparent conductive layer 11 to form the other electrode 12, so that a photoelectric converting device can be obtained.

EXAMPLE 4

Graphite (graphite DFP-2 manufactured by POCO Graphite, Inc. or the like) was worked to form a crucible having dimensions of 19.0 mm ϕ in the inner diameter, 25.0 mm ϕ in the outer diameter and 143 mm in length. At the bottom of the crucible, a nozzle member having a nozzle hole defined by laser machining was set.

The crucible was disposed in a furnace capable of being kept in an atmosphere of an inert gas such as Ar or He, and the temperature of the whole was set at 1450° C.

18 grams of silicon material was fed into this crucible through a passage similarly kept in an inert gas atmosphere, and completely melted. 0.15 MPa gaseous pressure was applied to the sufficiently melted silicon material to spray and discharge out the whole amount of the molten material straight out through the nozzle hole 3a.

The sprayed drops of the silicon material were allowed to free-fall in a cylindrical body 10 similarly kept in an inert gas atmosphere, to be cooled and solidified. The cylindrical body 10 was one formed of quartz, and the inner pressure thereof was kept equal to the outer pressure.

Ar gas containing oxygen was used for forming the inert gas atmosphere. By setting the oxygen flow amount with respect to the Ar flow amount, the oxygen concentration of the inert gas atmosphere was controlled.

Thereafter, the recovered silicon grains were spread all over a dish-like quartz container and heat-treated together with the quartz container in a baking furnace kept in a predetermined atmosphere. Thereby, the silicon grains were re-melted, so that single crystal grains can be manufactured.

EXAMPLE 4-1

Figure 9:
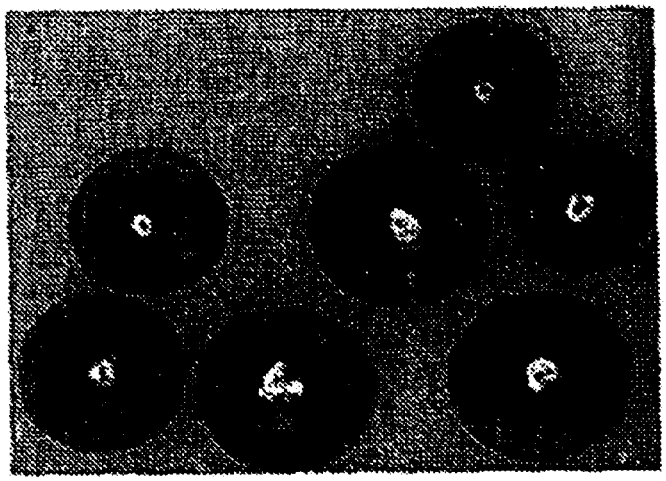
FIG. 9 is a photo showing the shape of a grain of the Example 4-1.

The atmosphere in the cylindrical body 10 was adjusted by controlling the flow amount of oxygen gas so that the oxygen concentration in the cylindrical body 10 became 2 atoms %. In this atmosphere, the melted silicon material was sprayed and allowed to free-fall to be cooled and solidified. The solidified silicon grains were monodisperse grains, namely, separate grains not coherent to one another. The appearance of such particles is shown in FIG. 9.

Comparative Example 4-1

The same process with that of Example 4-1 was carried out except that the oxygen flow was kept in stopped state, and the silicon molten solution was sprayed and solidified during falling. And the solidified silicon grains were recovered.

Figure 10:
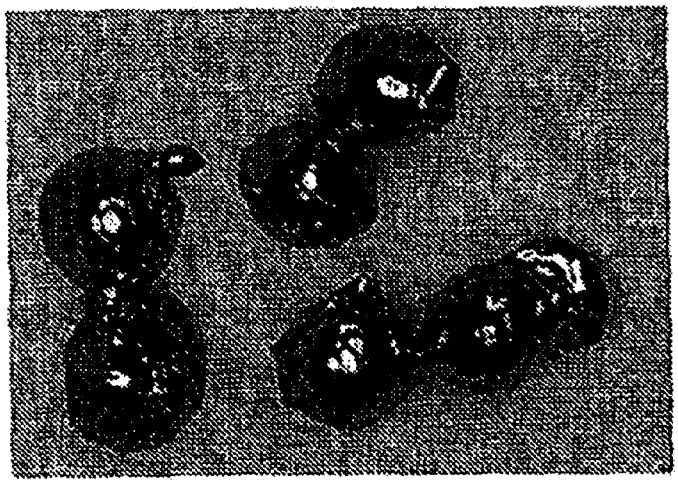
FIG. 10 is a photo showing the shape of a cohered grain of Comparative Example 4-1.
Figure 11:
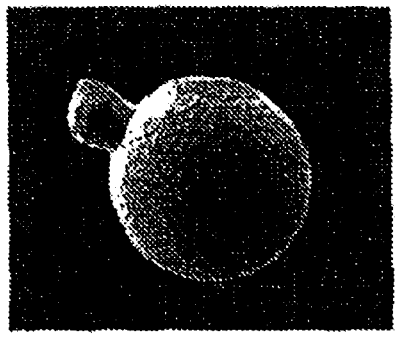
FIG. 11 is a photo showing the shape of a monodisperse grain of Comparative Example 4-1.

The recovered silicon grains included a number of coherent bodies in which grains were bonded to one another. The appearance of such a coherent body is shown in FIG. 10. The SEM image of a grain not coherent to one another is shown in FIG. 11.

EXAMPLE 4-2

Figure 12:
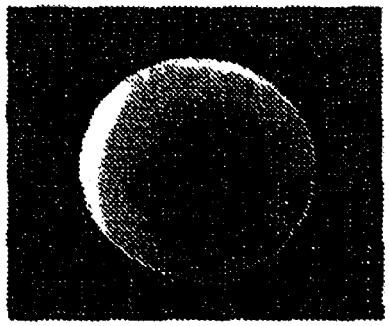
FIG. 12 is a SEM image showing the shape of a grain of the Example 4-2.

The silicon grains produced in Example 4-1 were re-melted to make single crystal grains. The shapes of the single crystal grains were observed, and a SEM image of one of them is shown in FIG. 12.

Comparative Example 4-2

Figure 13:
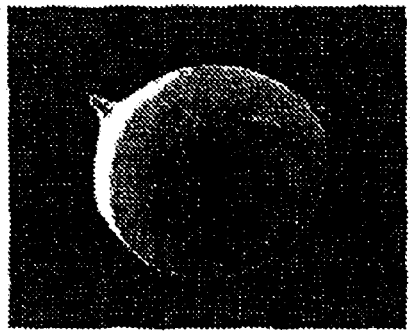
FIG. 13 is a SEM image showing the shape of a grain of the Comparative Example 4-2.

Among the silicon grains produced in Comparative Example 4-1, monodisperse grains (one being shown as a SEM image in FIG. 11) were re-melted to make single crystal grains similarly to Example 4-2. The shapes of the single crystal grains were observed, and a SEM image of one of them is shown in FIG. 13.

Each of the grains allowed to fall and solidified in the atmosphere containing oxygen maintained a spherical shape without any projection even after being re-melted and becoming single crystal as shown in Example 4-2. On the contrary, when the grain having a projection produced in Comparative Example 4-2 was re-melted, the projection on the surface of the grain was still remained.

EXAMPLE 4-3,

Comparative Example 4-3

The oxygen concentration in the atmosphere inside the cylindrical body 10 was changed stepwise as shown in Table 3, and the silicon molten solution was sprayed, cooled and solidified during falling.

TABLE 3

| | | Oxygen Conc. of Atmosphere (%) | Grain Shape |
|---|---|---|---|
| Comparative | 1-1 | 0.01 | Cohered |
| Example | 1-1 | 0.05 | Not cohered |
| | -2 | 0.5 | Not cohered |
| | -3 | 2.0 | Not cohered |
| | -4 | 10.5 | Not cohered |
| | -5 | 30.0 | Not cohered |
| | -6 | 40.0 | Not cohered |
| | -7 | 50.0 | Not cohered |
| Comparative | 1-2 | 55.0 | Cracked |

When the oxygen concentration was lower than 0.05 atoms %, grains cohered to one another and there were no monodisperse grains. Further, when the oxygen concentration was more than 50 atoms %, cracking occurred in the surface of the grains, so that the grains got out of shape.

EXAMPLE 4-4,

Comparative Example 4-4

From the silicon grains formed in Example 4-3, ones each having a high oxygen concentration in the atmosphere were selected and re-melted similarly to the case of example 4-2 to crystalline the same. The obtained grains were subjected to etching for removing an oxidized layer on the surface thereof with a mixed acid of hydrofluoric acid and nitric acid. Then, using the grains, such a solar battery as shown in FIG. 8 was manufactured. Light of a predetermined strength and a predetermined wavelength was applied to the solar battery to measure the solar battery characteristics and calculate the converting efficiency. The result is shown in Table 4.

On the other hand, separately from the measurement of the converting efficiency, the oxygen concentrations of the etched silicon grains were analyzed from the surface thereof by SIMS. The result is shown in Table 4. The analytical values shown here were the fixed oxygen concentration values obtained after inwardly digging the grains from the surface thereof.

TABLE 4

| | | Oxygen Conc. of Atmosphere atoms % | Oxygen Conc. of Grain atoms/cm$^3$ | Converting Efficiency % |
|---|---|---|---|---|
| Example | 4-1 | 30.0 | $3.4 \times 10^{17}$ | 3.2 |
| | -2 | 40.0 | $5.2 \times 10^{17}$ | 2.8 |
| | -3 | 50.0 | $2.0 \times 10^{18}$ | 1.5 |
| Comparative 4 | | 55.0 | $2.3 \times 10^{18}$ | Could Not Measured |

As shown in Table 4, grains each having an oxygen concentration higher than $2\times10^{18}$ atoms/cm$^3$ did not show any photoelectric converting characteristic.

What is claimed is:

1. A method for manufacturing semiconductor grains comprising steps of filling a semiconductor molten solution into a crucible having a cylindrical body member and a disk-shaped nozzle member detachably fitted to the bottom portion of the body member, applying a pressure to the semiconductor molten solution in the crucible, discharging out dropwise the semiconductor molten solution through a nozzle hole provided in the nozzle member, allowing the semiconductor molten solution to fall to cool and solidify the semiconductor molten solution during falling.

2. A method for manufacturing semiconductor grains as claimed in claim 1, in which the pressure not less than 0.01 MPa and not more than 0.7 MPa is applied to the semiconductor molten solution in the crucible to discharge out dropwise the semiconductor molten solution through the nozzle hole.

3. A method for manufacturing semiconductor grains as claimed in claim 1, in which a semiconductor material is melted in the crucible to form the semiconductor molten solution.

4. A method for manufacturing semiconductor grains as claimed in claim 1, in which the semiconductor material is silicon.

5. A method for manufacturing semiconductor grains as claimed in claim 1, wherein the body member comprises an inner wall member having an inner wall for hindering reaction with silicon and an outer wall member disposed outside the inner wall member for reinforcing the body member.

6. A method for manufacturing semiconductor grains comprising steps of adding grains acting as cores of crystal to a semiconductor material, filling a semiconductor molten material of the semiconductor material into a crucible, discharging out the semiconductor molten solution dropwise through a nozzle hole provided in the crucible to allow the semiconductor molten material to fall, and cooling and solidifying the molten material during falling, wherein the grains acting as cores of crystal are formed of one or two selected from the group consisting of silicon carbide, aluminum oxide, silicon oxide, diamond and graphite.

7. A method for manufacturing semiconductor grains as claimed in claim 6, in which a pressure is applied to the semiconductor molten solution in the crucible to discharge out dropwise the semiconductor molten solution through the nozzle hole.

8. A method for manufacturing semiconductor grains as claimed in claim 6, in which the semiconductor material is silicon.

9. A method for manufacturing semiconductor grains comprising steps of feeding a semiconductor molten material into a crucible, discharging out dropswise the semiconductor molten solution through a nozzle hole provided in the crucible to allow the semiconductor molten material to fall in an atmosphere containing oxygen, and cooling and solidifying the molten material during falling to form semiconductor grains, wherein the oxygen concentration of the resultant semiconductor grains is less than $2\times10^{18}$ atoms/cm$^3$.

10. A method for manufacturing semiconductor grains as claimed in claim 9, in which the resultant semiconductor grains are heat-treated to make single crystal semiconductor grains.

11. A method for manufacturing semiconductor grains as claimed in claim 9, in which the semiconductor is silicon.

12. A method for manufacturing semiconductor grains as claimed in claim 9, in which the atmosphere containing oxygen is argon containing oxygen or helium containing oxygen.

13. A method for manufacturing semiconductor grains comprising steps of feeding a semiconductor molten material into a crucible, discharging out dropwise the semiconductor molten solution through a nozzle hole provided in the crucible to allow the semiconductor molten material to fall in an atmosphere containing oxygen, and cooling and solidifying the molten material during falling to form semiconductor grains, wherein the oxygen concentration of the atmosphere is not less than 0.05 atom % and not more than 50 atom %.

*14. A method for manufacturing semiconductor grains comprising: feeding a semiconductor molten material into a crucible; discharging out dropwise the semiconductor molten material through a nozzle hole provided in the crucible; cooling and solidifying the molten material during falling to form semiconductor grains; and re-melting the resultant semiconductor grains at a temperature higher than its melting point to make single crystal semiconductor grains.*

* * * * *

UNITED STATES PATENT AND TRADEMARK OFFICE

CERTIFICATE OF CORRECTION

PATENT NO. : RE41,512 E
APPLICATION NO. : 12/030452
DATED : August 17, 2010
INVENTOR(S) : Kitahara et al.

It is certified that error appears in the above-identified patent and that said Letters Patent is hereby corrected as shown below:

On the Title page, column 1, item 75, please correct the inventors residences:

Nobuyuki Kitahara: Kyoto-shi, Kyoto, Japan
Toshio Suzuki: Higashiohmi-shi, Shiga, Japan
Noboru Suda: Kyoto-shi, Kyoto, Japan
Shin Sugawara: Higashiohmi-shi, Shiga, Japan
Hisao Arimune: Higashiohmi-shi, Shiga, Japan Signed and Sealed this
Twenty-ninth Day of March, 2011

David J. Kappos

David J. Kappos
*Director of the United States Patent and Trademark Office*